(12) United States Patent
Burckel et al.

(10) Patent No.: US 9,659,797 B1
(45) Date of Patent: May 23, 2017

(54) WAFER SCALE OBLIQUE ANGLE PLASMA ETCHING

(71) Applicant: Sandia Corporation, Albuquerque, NM (US)

(72) Inventors: David Bruce Burckel, Albuquerque, NM (US); Robert L. Jarecki, Jr., Albuquerque, NM (US); Patrick Sean Finnegan, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 142 days.

(21) Appl. No.: 14/489,362

(22) Filed: Sep. 17, 2014

(51) Int. Cl.
  *C23F 1/00* (2006.01)
  *H01L 21/67* (2006.01)
  *H01L 21/3065* (2006.01)
  *H01L 21/308* (2006.01)

(52) U.S. Cl.
  CPC .... *H01L 21/67069* (2013.01); *H01L 21/3065* (2013.01); *H01L 21/3085* (2013.01)

(58) Field of Classification Search
  CPC ........... H01L 21/67069; H01L 21/3065; H01L 21/308; H01L 21/67063; H01L 21/31144; H01L 21/31138; H01L 21/3086
  USPC .......... 156/345.3, 345, 36, 345.5, 345.36, 5; 438/706, 714, 719, 723, 725
  See application file for complete search history.

(56) References Cited

U.S. PATENT DOCUMENTS

| | | | |
|---|---|---|---|
| 6,270,621 B1 | 8/2001 | Tam et al. | |
| 6,528,805 B2 * | 3/2003 | Fang | H01J 37/32412 250/397 |
| 8,197,887 B1 | 6/2012 | Burckel | |
| 8,303,765 B2 | 11/2012 | Okita et al. | |
| 8,999,105 B2 * | 4/2015 | Loncar | G02B 6/136 156/345.48 |
| 2006/0163466 A1 * | 7/2006 | Park | H01J 37/026 250/251 |

(Continued)

FOREIGN PATENT DOCUMENTS

WO    WO 2013/147966 A2    10/2013

OTHER PUBLICATIONS

Ryu, et al., "Trajectories of Ions inside a Faraday Cage Located in a High Density Plasma Etcher", Korean J. Chem. Eng., 20(2), 2003, pp. 407-408.

(Continued)

*Primary Examiner* — Lan Vinh
(74) *Attorney, Agent, or Firm* — Martin I. Finston

(57) ABSTRACT

Wafer scale oblique angle etching of a semiconductor substrate is performed in a conventional plasma etch chamber by using a fixture that supports a multiple number of separate Faraday cages. Each cage is formed to include an angled grid surface and is positioned such that it will be positioned over a separate one of the die locations on the wafer surface when the fixture is placed over the wafer. The presence of the Faraday cages influences the local electric field surrounding each wafer die, re-shaping the local field to be disposed in alignment with the angled grid surface. The re-shaped plasma causes the reactive ions to follow a linear trajectory through the plasma sheath and angled grid surface, ultimately impinging the wafer surface at an angle. The selected geometry of the Faraday cage angled grid surface thus determines the angle at with the reactive ions will impinge the wafer.

18 Claims, 10 Drawing Sheets

(56) References Cited

U.S. PATENT DOCUMENTS

| | | | | |
|---|---|---|---|---|
| 2006/0219887 | A1* | 10/2006 | Hwang | H05H 3/02 250/251 |
| 2009/0039530 | A1* | 2/2009 | Fryklund | H01L 21/6835 257/778 |
| 2010/0096084 | A1 | 4/2010 | Lee et al. | |
| 2014/0045730 | A1* | 2/2014 | Walters | G01N 21/553 506/39 |

OTHER PUBLICATIONS

Lee, et al., "Oblique-Directional Plasma Etching of Si Using a Faraday Cage", Journal of the Electrochemical Society, 156 (7), 2009, pp. D222-D225.

Boyd, et al., "Directional Reactive Ion Etching at Oblique Angles", Appl. Phys. Lett. 36(7), Apr. 1, 1980, pp. 583-585.

Burek, et al., "Free-Standing Mechanical and Photonic Nanostructures in Single-Crystal Diamond", ACS Publications, Nano Letters 2012, 12, pp. 6084-6089.

\* cited by examiner

FIG. 10

TOP

WIRE MESH TO ALLOW IONS TO PENETRATE

BOTTOM

RECESSED TO ACCOMMODATE WAFER

SIDE $\theta = 45°$

WAFER SCALE OBLIQUE ANGLE PLASMA ETCHING

STATEMENT OF GOVERNMENT INTEREST

This invention was developed under contract DE-AC04-94AL85000 between Sandia Corporation and the U. S. Department of Energy. The U.S. Government has certain rights in this invention.

BACKGROUND

Modern integrated circuits (ICs) are fabricated in a planar fashion using "top-down" processes, where the reaction species is directed downward onto a substrate surface in a direction normal to the semiconductor substrate. During a conventional etching process, for example, a plasma is used to accelerate etchant species ions toward the substrate, where the ions are used to etch away unwanted material. The bulk of the etchant acceleration occurs in a "plasma sheath", the shape of which is determined by the etch chamber geometry and the local topography of the substrate.

To facilitate increased integration and speed of semiconductor devices, a geometrical progression of continuously scaling semiconductor devices (e.g., decreasing transistor size, increasing transistor density, etc.) has emerged. Reducing the size of a semiconductor device and/or a feature size of a semiconductor device can provide improved speed, performance, density, cost per unit, etc., of resultant integrated circuits. However, as the size of semiconductor devices and device features have been reduced, the planar type of fabrication techniques mentioned above are being challenged in their ability to produce modules comprising a plurality of integrated circuits located with high proximity to each other. For example, field effect transistors (FETs) are currently being fabricated with a gate feature that is only 22 nm wide—which is only a few tens of atoms in total. Clearly, the limits of lateral scaling of devices, and their manufacture, are being reached. Accordingly, the Semiconductor Industry Association has recognized the limits of conventional planar manufacture of semiconductor devices and has identified three-dimensional integrated circuit (3D-IC) fabrication as a core enabler in keeping pace with Moore's Law.

While various integrated circuits currently being manufactured are referred to as "three dimensional", they are truly formed of a multiple number of planar (i.e., two-dimensional) layers that are stacked one on top of another. As such, these circuits are fabricated using standard top-down planar process flow techniques, with through-wafer vias used to attach components on different layers to each other. Alternatively, wafer-to-wafer bonding may be used (in a face-to-face configuration) to provide electrical and/or optical connections between elements on adjacent planar structures.

The conventional processes used to form these multi-layer stacks cannot, however, be extended to perform process steps on the "vertical" walls of a structure, which is required to capture 3D volumetric scaling of transistor density. Therefore, in order to enable true 3D-IC fabrication, where the functional semiconductor devices are fabricated on surfaces which are not parallel to the wafer surface, new approaches to semiconductor device manufactured have to be engendered.

A new fabrication method for creating features on interior sidewalls of 3D semiconductor structures is described in detail in U.S. Pat. No. 8,197,887, issued on Jun. 12, 2012 and assigned to the assignee of this application. Here, a membrane exhibiting a pre-defined pattern is placed over an opening (cavity) of an individual die (referred to as a "unit cell"). A source of etchant (or material to be deposited) is oriented at a defined angle with respect to the unit cell, with the reactant species passing through the patterned membrane at an angle other than 90°, allowing for the pattern (etched or deposited material) to be re-created on a vertical sidewall of the unit cell. By moving the source into different orientations with respect to the unit cell, patterning of all interior sidewalls may be obtained.

SUMMARY

The following is a brief summary of subject matter that is described in greater detail herein. This summary is not intended to be limiting as to the scope of the claims.

Various embodiments of the present invention as described in detail herein relate to a fixture that may be utilized with standard planar plasma etch apparatus to provide for oblique etching of multiple die while yet in wafer form. In particular, wafer scale oblique angle etching of a semiconductor substrate is performed in a conventional plasma etch chamber by using a fixture that supports a multiple number of separate Faraday cages, each cage being formed to include an angled grid surface. When the fixture is in position over the wafer, each Faraday cage surrounds a separate one of the die locations on the wafer surface. The presence of the Faraday cages influences the local electric field surrounding each wafer die, essentially shielding each die from the plasma-induced electric field. In particular, the plasma sheath in the vicinity of each Faraday cage will be re-shaped to be disposed in alignment with the angled grid surface. The re-shaped plasma causes the reactive ions to follow a linear trajectory through the plasma sheath and then pass into the "shielded" Faraday cage. In accordance with the present invention, therefore, the angled grid surfaces of each Faraday cage function to change the conventional "top-down" etching process into an oblique angle etching process, the angle determined by the geometry of the Faraday cage.

The inventive fixture is configured as a metal support plate, with a plurality of Faraday cages formed on the metal plate and arranged in an area pattern that matches the positions of the die on the wafer. The fixture is positioned (and aligned) over the top surface of the wafer. A conventional plasma source may be used. However, the presence of the Faraday cages will re-shape the "plasma sheath" and re-orient the angle at which the etchant species will impinge each die on the wafer surface, since the etchant species will pass through the grid surface of the Faraday cages at a direction normal to the grid surface.

In some embodiments, only selected die are covered with Faraday cages (leaving, perhaps, 'corner' die exposed for control purposes). It is also possible to incorporate the Faraday cage fixture into the conventional clamp component that is used to hold the substrate in place within the etch chamber. Alternatively, the Faraday cage fixture may take the form of a separate component housed within the otherwise conventional plasma etch chamber. In yet another embodiment, the Faraday cage fixture may be attached to the wafer before it is introduced into the chamber itself. Regardless of the ordering of the steps, the inclusion of the inventive fixture allows for wafer scale etching of oblique-angled features across a wafer within a conventional "top down" plasma etch chamber.

In one exemplary application, it is possible to utilize the Faraday cage-based oblique angle etching fixture of the present invention in combination with the vertical sidewall patterning techniques as discussed in the above-cited '887 patent in order to provide the various angles required for etchant to pass through the membrane and perform vertical sidewall patterning within a unit cell.

BRIEF DESCRIPTION OF THE DRAWINGS

Referring now to the drawings, where like numerals represent like parts in several views:

FIG. 10 illustrates the same manual chamber as shown in FIG. 9, in this case showing the placement of the oblique angle etching fixture on the wafer before it is loaded in the chamber;

DETAILED DESCRIPTION, INCLUDING EXAMPLES

Figure 1:
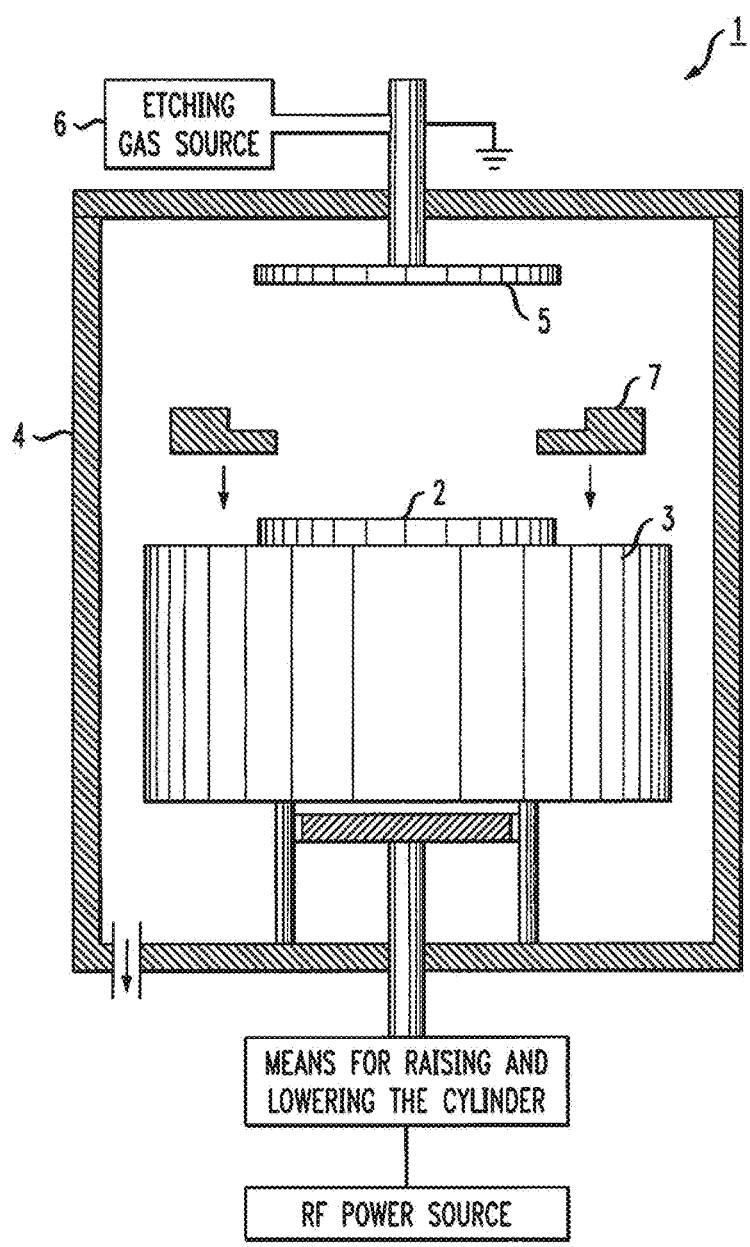
FIG. 1 illustrates a typical prior art etch chamber that may be used to perform plasma etching of integrated circuits.

Plasma etch chambers for processing semiconductor substrates are well-known in the art and can be exemplified by reference to prior art plasma etch chamber 1 of FIG. 1. As shown, a semiconductor substrate (wafer) 2 to be etched is mounted on an RF-powered cathode support pedestal (platen) 3, which is positioned within a vacuum chamber 4. A gas distribution plate 5 allows for etchant plasma precursor gas to enter vacuum chamber 4 from an external gas source 6. Gas distribution plate 5 may also function as the anode of the arrangement, and is grounded as shown. A metal clamp ring 7 (shown in cut-away fashion) overlies wafer 2 during processing, and is supported on pedestal 3 when in position over wafer 2. The arrows in FIG. 1 illustrate the movement of clamp ring 7 to be in position over wafer 2, where ring 7 will hold the outer edge of wafer 2 in fixed position, leaving the individual die locations (not shown) on wafer 2 exposed for processing. Once wafer 2 is in place, the precursor gas is introduced into vacuum chamber 4 and the RF system is energized. The combination of the RF field present in the vacuum chamber with the precursor gas creates an ionized plasma of a reactive species that can then be used to etch the planar substrate surface.

Figure 2:
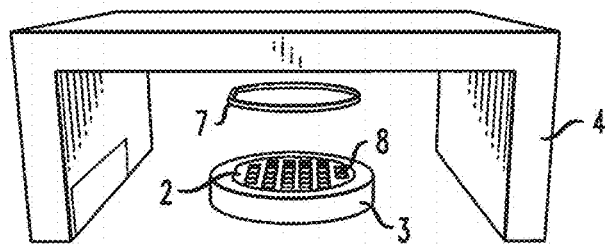
FIG. 2 is a simplified diagram of selected components of a prior art etch chamber, showing in particular a wafer mounted on a platform and an associated clamp ring.
Figure 3:
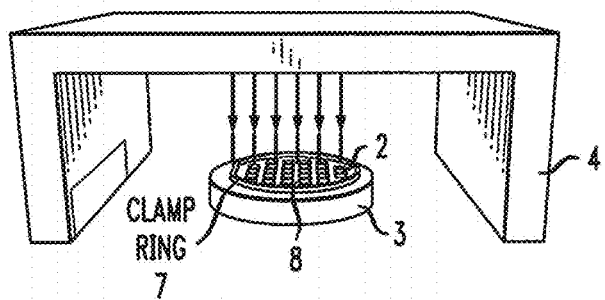
FIG. 3 is another view of the configuration of FIG. 2, in this case with the clamp ring in place and the conventional "top-down" plasma etch process taking place.

FIG. 2 is an isometric view, in simplified form, of selected elements forming prior art chamber 1. Particularly evident in this view is the geometry of clamp ring 7, illustrated in its "elevated" position above wafer 2 (which is shown as positioned on platen 3). Wafer 2 is also shown as including several individual "die" 8 that are being fabricated within the exposed upper surface of semiconductor wafer 2. FIG. 3 is another isometric view, in which metal clamp ring 7 has been positioned to surround an outer perimeter of wafer 2 and hold wafer 2 in a fixed location on platen 3. It is clear from this view of FIG. 3 that the various die 8 remain exposed for processing even after clamp ring 7 is in place. In this conventional prior art apparatus, the etchant species is directed downward through the created plasma sheath, in a direction that is normal to the surface of wafer 2. Thus, the configuration as shown in FIGS. 1-3 exemplifies the typical prior art "top-down" plasma etching process conditions, which utilize a structure that can only provide etching of horizontal surfaces, and is incapable of oblique angle etching.

Figure 4:
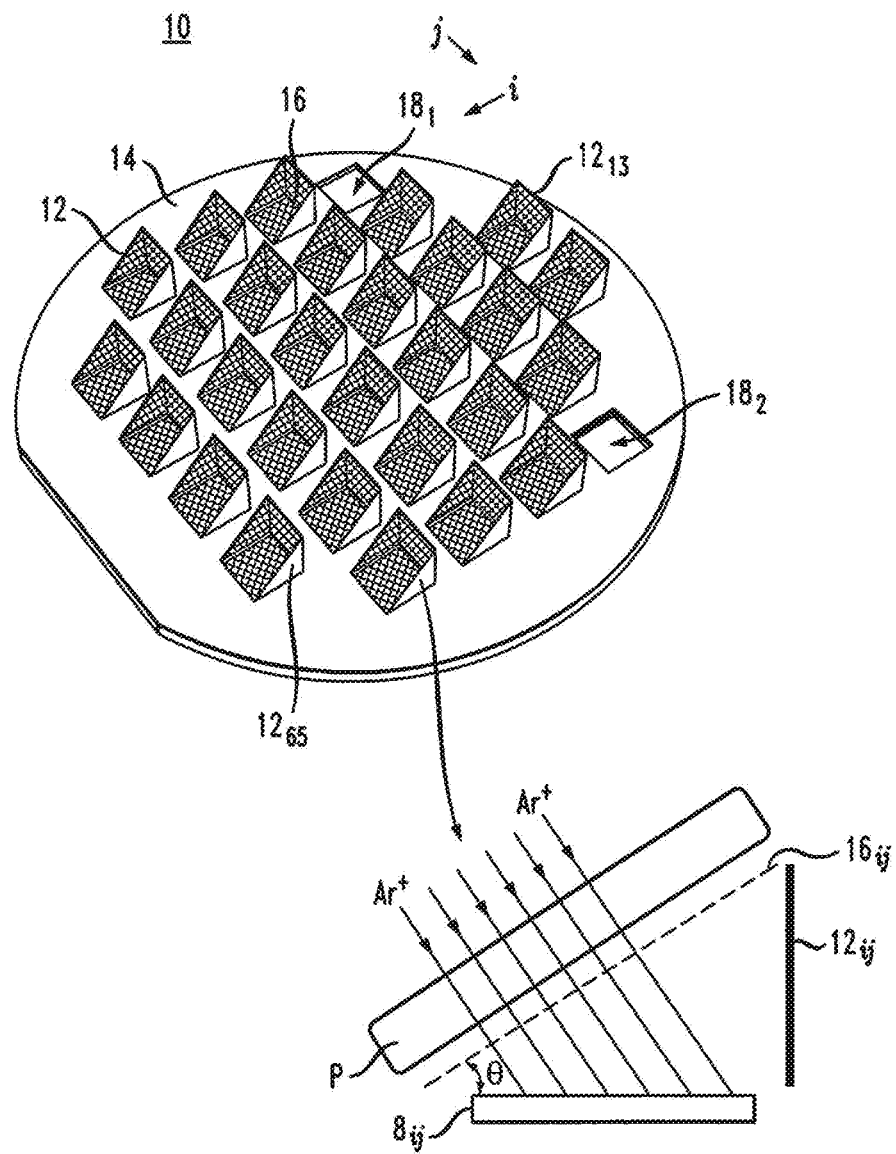
FIG. 4 is an isometric view of an exemplary fixture formed in accordance with the present invention to enable wafer scale oblique angle etching within a conventional plasma etch chamber, the fixture including a plurality of individual Faraday cages disposed in a pattern that will align with the separate die on the wafer being processed.

FIG. 4 illustrates an exemplary fixture 10 formed in accordance with the present invention that may be used with conventional plasma etch apparatus (such as that described above, for example) to provide a means for performing wafer scale oblique angle etching; that is, performing oblique angle etching within each die on a wafer surface. As mentioned above, the ability to provide oblique angle etching allows for fabrication of both 3-D ICs, and 3-D interconnects for ICs. The configuration of the present invention, providing wafer scale oblique angle etching, allows for the creation of such 3-D structures in a high volume manufacturing environment.

Referring to FIG. 4, fixture 10 is shown as comprising a plurality of individual Faraday cages 12 supported on a metallic support plate 14. Each Faraday cage 12 is also formed of a conductive material, and in this particular embodiment takes the form of a triangle that includes an angled surface 16. As shown, angled surface 16 comprises a grid configuration, including apertures that allow for the passage of ions through Faraday cage 12 and onto the wafer surface. At times, the "grid" surface of a Faraday cage may also be referred to as a "screen" or "wire mesh".

An enlarged side view of an exemplary Faraday cage 12$ij$ is depicted in the inset to FIG. 4, and is useful in understanding the principles of the present invention. As is well-known in the art, a Faraday cage is simply a closed box of a conductive material, including a conductive grid formed across the top of it. The Faraday cage shields the space inside the cage against the electric field that is present in the plasma surrounding the cage, creating a re-shaped plasma sheath P as shown that follows the contour of angled grid surface 16. Under these circumstances, ions entering plasma sheath P will be oriented to follow the electric field lines within the plasma sheath, and pass through angled grid surface 16 in a direction normal to surface 16, as shown in the inset to FIG. 4. Once the ions pass through grid surface 16, they will enter the shielded interior region of Faraday cage 12$ij$, where no electric field is present. Thus, in the absence of an electric field, the ions will maintain their directionality normal to angled grid surface 16 and impinge the wafer surface at this angle.

With an understanding of these principles of operation with respect to a Faraday cage, a discussion of applying these principles to providing wafer scale oblique angle plasma etching follows.

As shown in FIG. 4, Faraday cages 12 are disposed in a matrix-type of organization, with the individual cages defined as 12$_{ij}$, i being the "row" of the matrix, and j being the "column" of the matrix. In particular, the matrix layout of Faraday cages 12 is created to correspond to the position of the separate die being fabricated on a semiconductor wafer (not shown). In the particular case illustrated in FIG. 4, the geometry of Faraday cages 12 is that of a right triangle, with one of the mutually perpendicular legs lying contiguous with support plate 14. In this orientation, grid surfaces 16 form a 45° angle with respect to the plane of support plate 14 (and an underlying wafer during processing). In the embodiment as shown in FIG. 4, fixture 10 includes a pair of openings, denoted 18$_1$ and 18$_2$, where Faraday cages 12 are not placed. In some cases, it may be desired to leave selected die locations "exposed"; that is, not covered by a Faraday cage. This may be for process control regions, or the like.

In order to perform wafer scale etching, fixture 10 as shown in FIG. 4 is electrically coupled to the cathode plate of the associated etch chamber. The platen supporting the wafer is typically used as the cathode in a plasma etching process. The individual Faraday cages 12 are therefore also coupled to the cathode by virtue of their conductive connection to metallic support plate 14. When the plasma etchant species is created in the vacuum chamber in the presence of the RF field, the presence of the multiple Faraday cages 12 will shield the plurality of dies formed on the wafer, with each individual Faraday cage surrounding and shielding a separate and distinct die. The presence of multiple Faraday cages 12 will re-shape the plasma sheath in the vicinity of each cage such that the local portion of the plasma sheath will be aligned with each angled grid surface 16, in the manner shown in the inset to FIG. 4. As a result, the ions will pass through each grid surface 16 at a direction normal to the grid plane and then impinge the wafer surface along the angle defined by the angular separation between grid surface 16 and the planar wafer surface, particularly impinging each of the die formed on the wafer surface. In accordance with the present invention, therefore, the incident angle of the ions on the wafer surface is no longer the conventional vertical direction associated with conventional planar "top down" processing, but is controlled by the orientation of the angled gird surfaces of the multiple Faraday cages disposed on the fixture.

Figure 5:
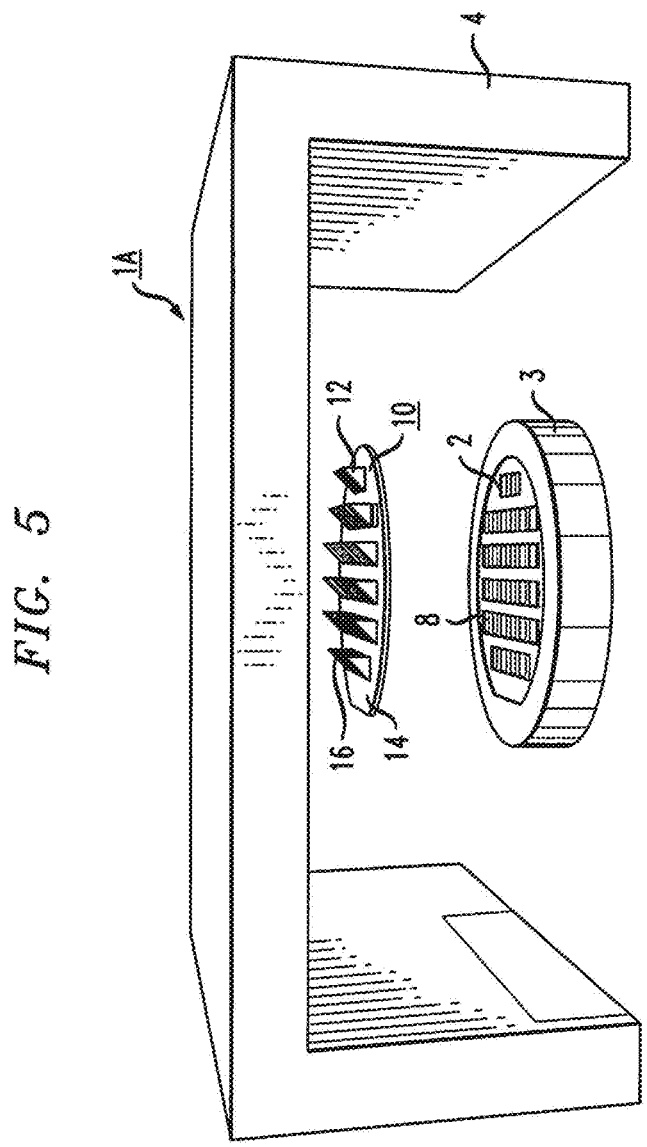
FIG. 5 is a simplified view of selected components of a plasma etch chamber incorporating the inventive oblique angle etch fixture.
Figure 6:
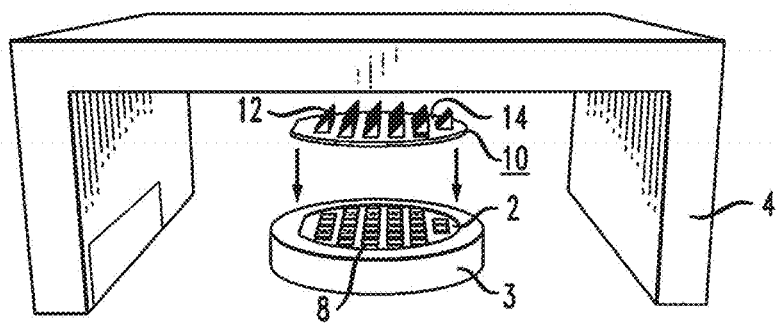
FIG. 6 illustrates the direction of movement of the fixture with respect to the wafer such that the individual Faraday cages on the fixture will cover separate, individual die on the wafer.

FIG. 5 is a simplified isometric view of a plasma etch chamber 1A, which is similar in form to that described above, but which in this case incorporates fixture 10 of the present invention with the conventional plasma etch process components. In the view of FIG. 5, the individual die 8 being fabricated within wafer 2 are clearly visible. As discussed above in association with FIG. 4, fixture 10 includes a plurality of individual Faraday cages 12 that will align with die 8 in a one-to-one relationship when fixture 10 is positioned over wafer 2. Indeed, it is possible to utilize fixture 10 as the "clamp" component that holds wafer 2 in its proper position on platen 3. Angled grid surfaces 16 of Faraday cages 12 are evident in this view as well. FIG. 6 illustrates the step of moving fixture 10 in place over wafer 2, so that Faraday cages 12 will align with die 8, and wafer 2 will be held in place on platen 3.

Figure 7:
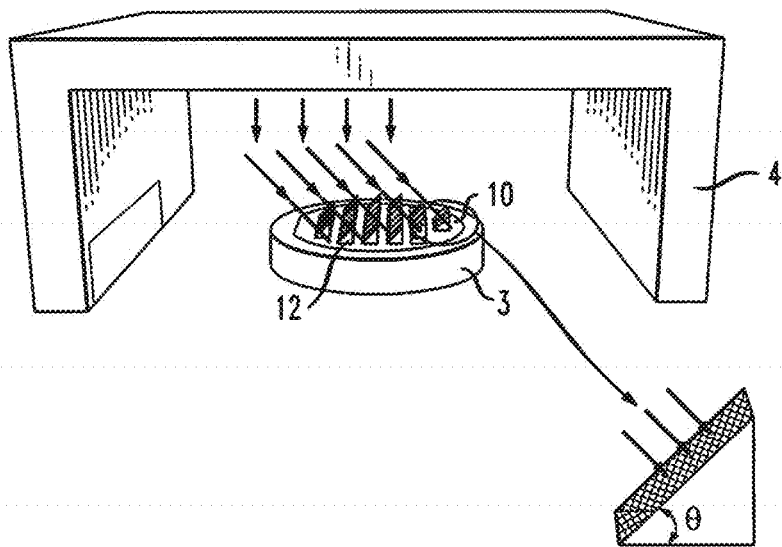
FIG. 7 illustrates the fixture in place on the semiconductor wafer.

Once fixture 10 is in place over wafer 2, fixture 10 is coupled to the cathode potential of the chamber. Typically, a connection is made between metallic support plate 14 of fixture 10 and platen 3 to form this cathode connection. At this point, the RF source is activated (not shown), a precursor gas is introduced into the chamber, and a plasma etching process is initiated. FIG. 7 illustrates the direction that the plasma ions will travel as they pass through the multiple angled grid surfaces 16, the direction traveled by the ions through grid surfaces 16 as described in detail above.

Figure 8:
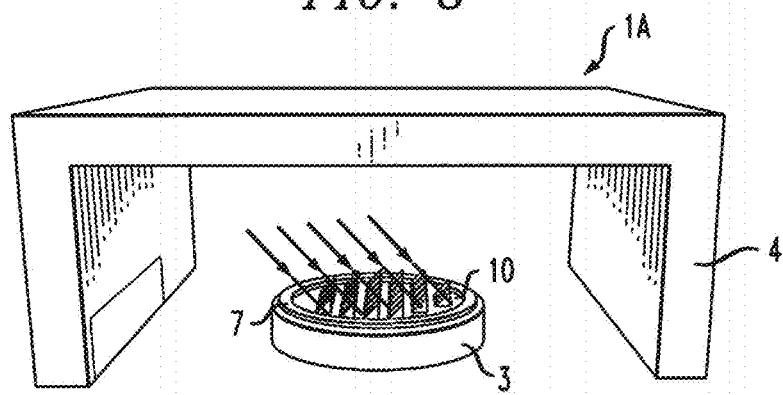
FIG. 8 is an alternative configuration of the arrangement shown in FIG. 7, including a separate clamp ring to hold the fixture in place on the semiconductor wafer.

While the configuration as shown in FIG. 7 utilizes fixture 10 to function as the clamping mechanism that keeps wafer 2 in its proper position on platen 3, it is to be understood that an alternative embodiment may still utilize original clamp ring 7 in combination with fixture 10. FIG. 8 illustrates this alternative embodiment, where fixture 10 is first positioned over and aligned with wafer 2 (wafer 2 not visible in this view). Once fixture 10 is properly positioned, clamp ring 7 is shown as positioned over the combination of wafer 2 and fixture 10, holding them together and in place on the surface of platen 3.

Figure 9:
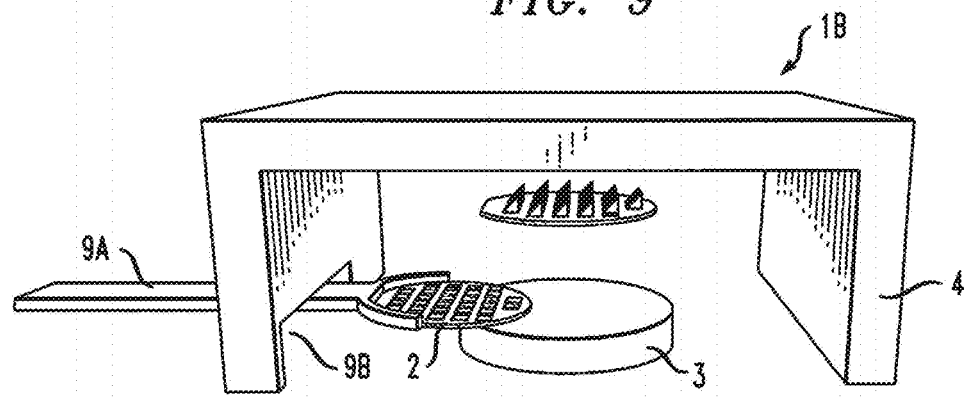
FIG. 9 illustrates an alternative type of plasma etch chamber, in this case requiring a manual process to load the wafer in the chamber.

There are a variety of conventional plasma etch chambers that utilize a manual load feature. That is, an individual wafer is placed in a holder outside of the vacuum chamber and then passed through a valve door in a vacuum load lock to enter the plasma chamber. FIG. 9 is a simplified illustrate of one such manual load plasma etch chamber 1B. As shown, wafer 2 is first positioned on a holder 9A, and then passed through a valve door 9B to be placed on platen 3. Once wafer 2 is in place on platen 3 (and holder 9A removed from the chamber), fixture 10 is positioned on top of wafer 2 and used as discussed above to perform wafer scale oblique angle etching.

Figure 10:
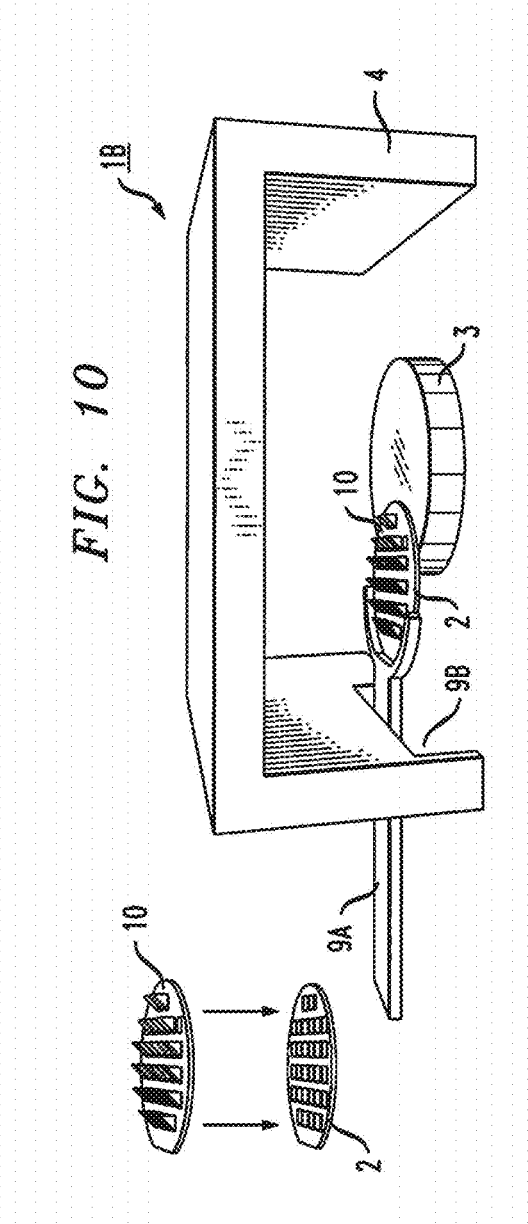

In this scenario where a manual load process is used, it is also possible to first position fixture 10 on wafer 2 before loading the wafer in the etch chamber. This alternative is shown in FIG. 10, which illustrates the placement of fixture 10 on wafer 2 with holder 9A then used to pass the combination of wafer 2 and fixture 10 through valve door 9B and onto platen 3. As long as the dimensions of valve door 9B are sufficient to accommodate the extra height associated with fixture 10, this particular configuration requires no modifications to a conventional plasma etch chamber, yet provides for wafer scale oblique angle etching.

Figure 11:
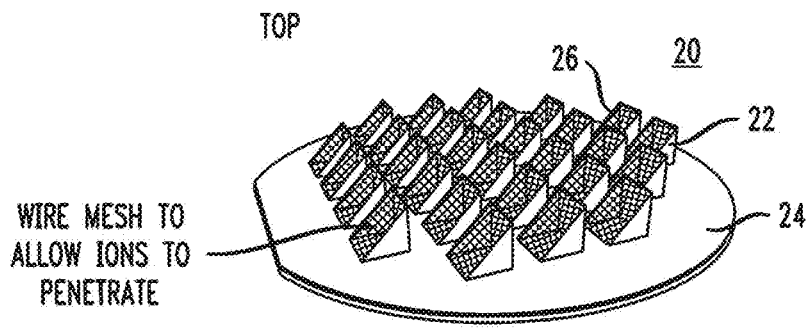
FIG. 11 is an isometric view of another oblique angle etching fixture formed in accordance with the present invention.
Figure 12:
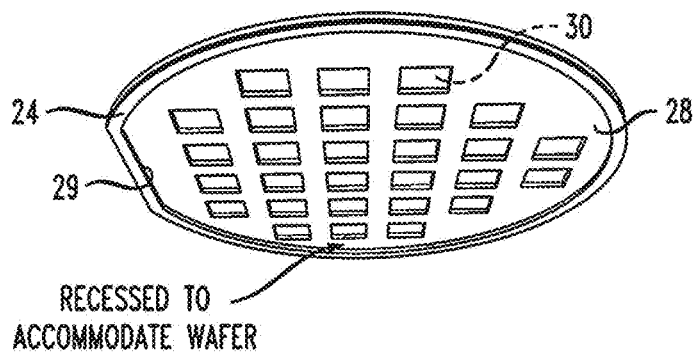
FIG. 12 is a view of the underside of the fixture of FIG. 11, in this case showing a recessed area formed in the support plate of the fixture for surrounding a wafer being processed.
Figure 13:
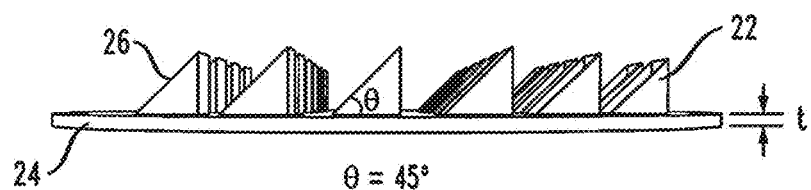
FIG. 13 is a side view of the embodiment shown in FIGS. 11 and 12.

FIGS. 11-13 contain various views of an exemplary fixture 20 formed in accordance with another embodiment of the present invention. Again, a plurality of Faraday cages 22 are arranged on a metallic support plate 24, with each cage 22 positioned so as to align with a die on a substrate being processed (no openings for control, registration or other purposes are shown on fixture 20). As with the configuration shown in FIG. 4, the plurality of Faraday cages 22 are configured as right triangles, in this case with angled surfaces 26 covered with wire mesh and used as the aperture to accept reactive ions during an etch process. That is, as with the configuration of FIG. 4, the plasma ions will pass through angled wire mesh surfaces 26 at an angle normal to surfaces 26, thus forming an oblique incident angle with respect to the underlying die surfaces.

FIG. 12 is an isometric view of the underside of fixture 20, showing a recessed area 28 formed within the metallic support plate that is used to accommodate wafer 2. In accordance with this embodiment of the present invention, recessed area 28 is formed to completely surround wafer 2 in its position of platen 3. The topology of recessed area 28 is shown to include a "flat" 29 along one edge, where flat 29 will register with the flat endface of the wafer being processed. As is well-known by those skilled in the art, semiconductor wafers can be formed to include a "flat" or a "notch"; that is, formed to include a side surface that is particularly configured to be used as an alignment fiducial (at times referred to as a "wafer flat"). By creating recessed area 28, fixture 20 may be placed on top of wafer 2 (not shown) and used as a "clamp" to hold wafer 2 in place on platen 3 (also not shown). A plurality of openings 30, forming a portion of Faraday cages 22 is also visible in this view. FIG. 13 is a side view of fixture 20, showing the position of Faraday cages 22 over openings 30, with angled wire mesh surfaces 26 disposed at an angle θ of 45° with respect to support 24.

Figure 14A:
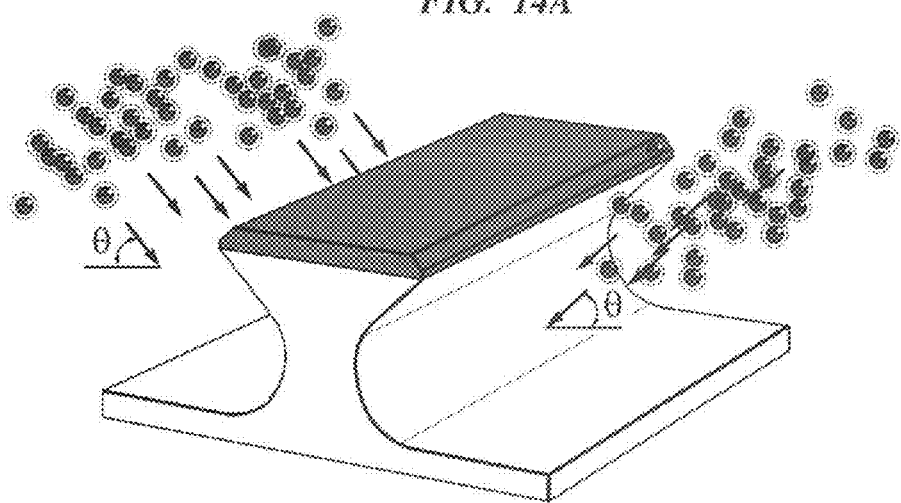
FIG. 14A and FIG. 14C illustrate two different Faraday cage geometries that may be used, with FIG. 14B and FIG. 14D illustrating the type of oblique angle etching that may be formed using these cages.
Figure 14B:
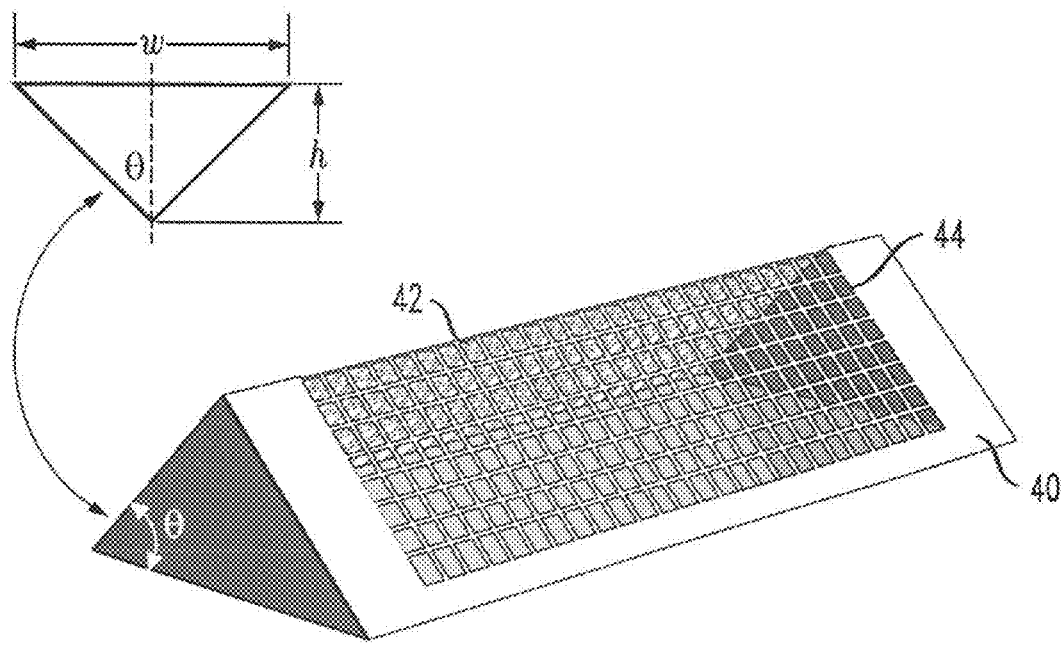
Figure 14C:
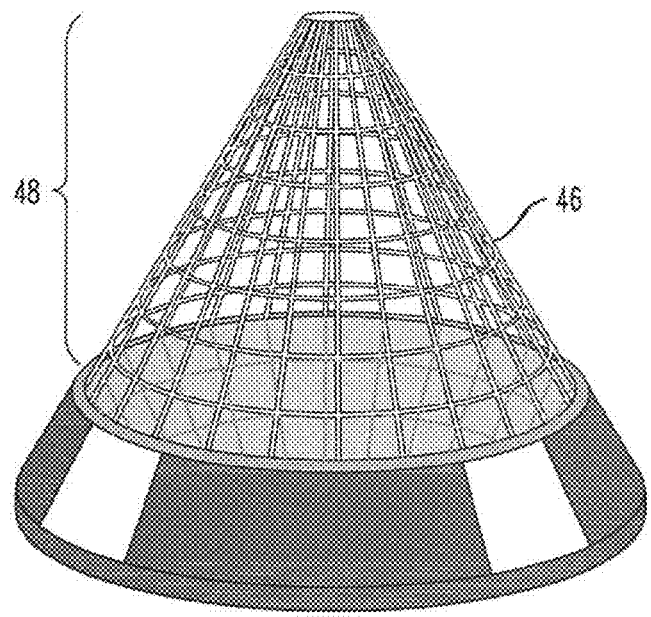
Figure 14D:
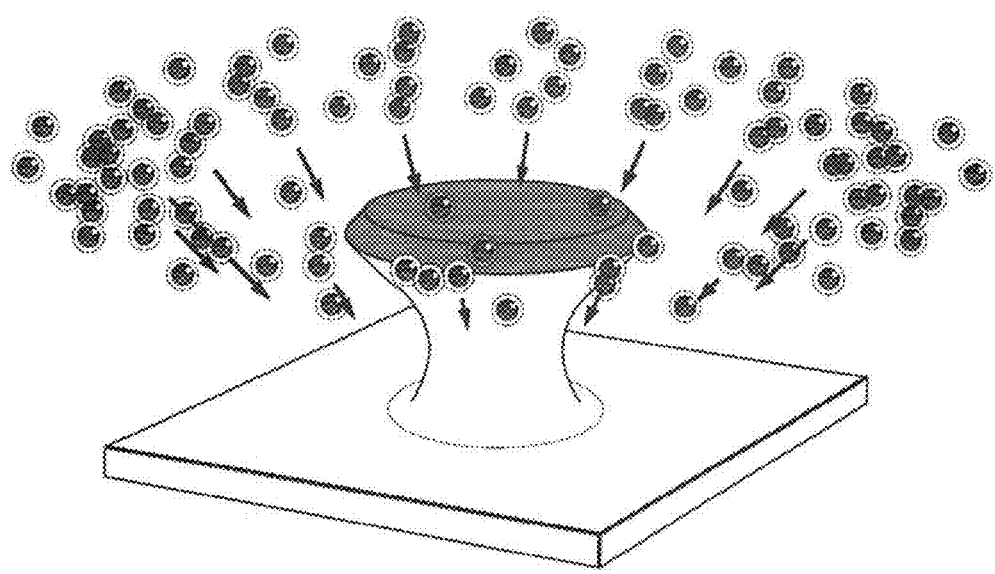

As mentioned above, Faraday cage configurations other than the right triangle geometry shown in the above embodiments may be used. FIG. 14A illustrates an exemplary Faraday cage 40 configured as an isosceles triangle. In the case where both angled surfaces 42 and 44 are formed as grids, etching on both vertical surfaces of an enclosed semiconductor structure will take place, as shown in FIG. 14B. FIG. 14C illustrates a Faraday cage 46 that exhibits a conical geometry, where an upper portion 48 of the cone structure is formed as the angled mesh surface that allows entry to plasma ions, resulting in the etched structure as shown in FIG. 14D. Other possible Faraday cage geometries may be used, as long as the cage includes some type of angled surface that will re-direct the reactive ions and enable the oblique angle etching process. Indeed, it may be possible to form a fixture which is an "empty" substrate, and the user may populate the surface with various ones of Faraday cages that are desired to be used, where different cage geometries may be used at different locations. It is also to be understood that while the above discussion referred to provision of "oblique" angle etching, other orientations of etching may be achieved by used a fixture including a plurality of Faraday cages formed in accordance with the present invention. Inasmuch as the directionality of the ions onto an underlying wafer is controlled by the orientation of grid surfaces of the Faraday cages, any desired modification to the etch angle can be provided by modifying the angular orientation of the grid surface(s) of the Faraday cages.

The Faraday cage configurations illustrated in FIGS. 14A and 14C are pictured and described in International Patent Application Publication No. WO 2013/147966 A2, published Oct. 3, 2013 under the title, "Small-Scale Fabrication Systems and Methods." Etched structures as illustrated in FIGS. 14B and 14D are likewise pictured and illustrated in the same International Patent Application Publication.

What is claimed is:

1. An arrangement for performing wafer scale, angled plasma etching, the arrangement comprising
a conductive support plate; and
a plurality of individual Faraday cages disposed over and attached to the conductive support plate in a pattern that corresponds to die locations on a semiconductor wafer to be etched, each Faraday cage including a grid-covered angled surface such that reactive ions utilized for plasma etching pass through the grid-covered angled surface at an orientation normal to the angled surface and thereafter impinge a wafer surface.

2. The arrangement as defined in claim 1 wherein the arrangement is formed as a clamping fixture for holding a semiconductor wafer in place within a plasma etch chamber during an oblique angle etching process.

3. The arrangement as defined in claim 1 wherein the plurality of individual Faraday cages are associated with the plurality of die on a one-to-one basis.

4. The arrangement as defined in claim 1 wherein the plurality of individual Faraday cages is less than the plurality of wafer die regions, leaving at least one die exposed for horizontal etching.

5. The arrangement as defined in claim 1 wherein the Faraday cages have a geometrical form selected from the group consisting of: right triangles, isosceles triangles, pyramids and cones.

6. The arrangement as defined in claim 1 wherein the conductive support plate includes a recessed underside area that is sized to accommodate and cover the semiconductor wafer during the oblique angle etching process.

7. The arrangement as defined in claim 6 wherein the recessed underside area includes a flat side surface for engaging a wafer flat when positioned to surround the wafer.

8. The arrangement as defined in claim 1 wherein the reactive ions passing through the plurality of grid-covered angled surfaces impinge the wafer surface at an incidence angle defined by an angular separation between the plurality of grid-covered angled surfaces and the planar wafer surface.

9. A plasma etch chamber for performing wafer scale plasma etching of semiconductor wafers, the chamber including
a platen for supporting a semiconductor wafer during processing, the platen utilized as the cathode of the plasma etch process;
a plasma source for generating reactive ions within the chamber and directing the reactive ions in a linear path toward a wafer mounted on the platen; and
an etching fixture disposed over a mounted wafer and coupled to the platen so as to also form the cathode of the plasma process, the etching fixture comprising a plurality of separate Faraday cage structures disposed on a metal support plate, the plurality of separate Faraday cage structures disposed in a pattern across the metal support plate in a pattern that associates each individual Faraday cage with a separate die location on a mounted wafer, each Faraday cage including an angled grid surface for re-shaping a plasma sheath associated with the plasma source and re-directing the reactive ions to pass through the angled grid surfaces in a direction normal to the grid surfaces and impinge the wafer surface.

10. The plasma etch chamber as defined in claim 9 wherein the chamber further comprises a clamp ring for holding a semiconductor wafer in a predefined location on the platen.

11. The plasma etch chamber as defined in claim 9 wherein the chamber operates as an automatic process chamber and the fixture is retained within the chamber.

12. The plasma etch chamber as defined in claim 11 wherein the fixture is combined with a clamp ring used to hold a wafer in place on the platen.

13. The plasma etch chamber as defined in claim 9 wherein the chamber operates as a manual load chamber, and the fixture is disposed over and attached to a wafer prior to loading the wafer in the chamber.

14. The plasma etch chamber as defined in claim 9 wherein the ions passing through each angled grid surface of the plurality of separate Faraday cages impinges the underlying wafer at an incidence angle substantially equal to an angular separation between the angled grid surface and the wafer surface.

15. A method of performing angled etching as a wafer scale process across the surface of a semiconductor wafer, the method including the steps of:
    introducing a semiconductor wafer into a plasma etch chamber;
    positioning an etch fixture over the semiconductor wafer, the etch fixture comprising a plurality of separate Faraday cage structures disposed on a metal support plate, the plurality of separate Faraday cage structures disposed in a pattern across the metal support plate in a pattern that associates each individual Faraday cage with a separate die location on a mounted wafer, each Faraday cage including an angled grid surface;
    coupling the etch fixture to a cathode potential of a plasma source; and
    initiating the plasma source to generate a stream of energized ions directed toward the wafer, wherein the presence of the Faraday cages functions to re-shape a plasma sheath in the vicinity of each Faraday cage and re-direct the stream of ions through the angled grid surfaces of the plurality of Faraday cages, the ions passing through the angled grid surface in a direction normal to the grid surface and providing angled etching at the planar wafer surface.

16. The method as defined in claim 15 wherein the fixture is positioned over the semiconductor wafer after the semiconductor wafer is loaded in the plasma etch chamber.

17. The method as defined in claim 15 wherein the fixture is positioned over the semiconductor wafer before the semiconductor wafer is loaded into the plasma etch chamber, the combination of the semiconductor wafer and fixture then being introduced into the plasma etch chamber.

18. A method of performing angle etching as a wafer scale process on a surface of a semiconductor wafer, comprising:
    coupling a plurality of individual Faraday cage structures having angled grid surfaces to a cathode potential of a plasma source; and
    directing a stream of energized ions from the plasma source through the angled grid surfaces of the plurality of Faraday cages so as to thereafter impinge the wafer surface, wherein the ions directed through the grid surface of each individual Faraday cage impinge a respective corresponding die location on the wafer surface.

* * * * *